United States Patent
Herdman

(10) Patent No.: US 10,882,756 B2
(45) Date of Patent: *Jan. 5, 2021

(54) REGENERATION OF ETCH SOLUTIONS CONTAINING TRIVALENT MANGANESE IN ACID MEDIA

(71) Applicant: MacDermid Acumen, Inc., Waterbury, CT (US)

(72) Inventor: Roderick D. Herdman, Kingsbury (GB)

(73) Assignee: MacDermid Acumen, Inc., Waterbury, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/800,186

(22) Filed: Feb. 25, 2020

(65) Prior Publication Data

US 2020/0189929 A1 Jun. 18, 2020

Related U.S. Application Data

(62) Division of application No. 13/870,232, filed on Apr. 25, 2013, now abandoned.

(51) Int. Cl.
| | | |
|---|---|---|
| *C25B 1/21* | (2006.01) | |
| *C01G 45/02* | (2006.01) | |
| *C09K 13/04* | (2006.01) | |
| *H05K 3/38* | (2006.01) | |

(52) U.S. Cl.
CPC .............. *C01G 45/02* (2013.01); *C09K 13/04* (2013.01); *C25B 1/21* (2013.01); *H05K 3/381* (2013.01)

(58) Field of Classification Search
CPC .......... C01G 45/02; C09K 13/04; C25B 1/21; H05K 3/381
See application file for complete search history.

(56) References Cited

U.S. PATENT DOCUMENTS

| | | |
|---|---|---|
| 2,739,869 A | 3/1956 | Parsons |
| 4,610,895 A | 9/1986 | Tubergen et al. |
| 7,056,424 B2 | 6/2006 | De Boer et al. |
| 8,303,840 B2 | 11/2012 | Nanjundaswamy et al. |
| 9,534,306 B2 * | 1/2017 | Pearson .................. C25B 11/12 |
| 10,260,000 B2 * | 4/2019 | Pearson .................. C25B 1/00 |
| 2005/0199587 A1 | 9/2005 | Bengston |
| 2009/0092757 A1 | 4/2009 | Satou et al. |
| 2011/0140035 A1 | 6/2011 | Schildmann et al. |
| 2013/0186774 A1 | 7/2013 | Pearson et al. |

FOREIGN PATENT DOCUMENTS

| | | |
|---|---|---|
| EP | 0795628 A1 | 9/1997 |
| WO | 2009023628 A2 | 2/2009 |

OTHER PUBLICATIONS

Perez-Benito, J.F. Perez-Benito et al, "A Kinetic Study of the Reduction of Colloidal Manganese Dioxide by Oxalic Acid," Journal of Colloid and Interface Science, vol. 177, Article No. 0034, 1996, pp. 288-297.

CH. Comninellis et al., "Electrochemical production of manganic sulfate in concentrated H2SO4," Journal of the Electrochemical Society, Electrochemical Science and Technology, Apr. 1982, vol. 129, pp. 749-752.

* cited by examiner

*Primary Examiner* — Arun S Phasge
(74) *Attorney, Agent, or Firm* — Carmody Torrance Sandak & Hennessey LLP

(57) ABSTRACT

A method of regenerating an etch solution comprising a metastable complex of manganese(III) ions in a strong acid is described in which at least a portion of the manganese(III) ions in the metastable complex have been destabilized, causing them to disproportionate into manganese dioxide and manganese(II) ions. The method includes the steps of i) adding an effective amount of a reducing agent to the solution; ii) allowing the reducing agent to react with the solution to cause manganese dioxide to dissolve; and (iii) applying an electrical current to regenerate manganese(III) ions in the solution.

20 Claims, No Drawings

REGENERATION OF ETCH SOLUTIONS CONTAINING TRIVALENT MANGANESE IN ACID MEDIA

FIELD OF THE INVENTION

The present invention relates generally to improved processes for regenerating etch solutions containing trivalent manganese.

BACKGROUND OF THE INVENTION

It is well known to plate non-conductive substrates, (i.e. plastics) with metal for a variety of purposes. Plastic moldings are relatively inexpensive to produce and metal plated plastic is used for many applications. For example, metal plated plastics are used for decoration and for the fabrication of electronic devices. An example of a decorative use includes automobile parts such as trim. Examples of electronic uses include printed circuits, wherein metal plated in a selective pattern comprises the conductors of the printed circuit board, and metal plated plastics used for EMI shielding. ABS resins are the most commonly plated plastics for decorative purposes while phenolic and epoxy resins are the most commonly plated plastics for the fabrication of printed circuit boards.

There are typically many stages involved in the plating of plastics. The first stage involves etching the plastic in order to provide mechanical adhesion of the subsequent metallic coatings and to provide a suitable surface for the adsorption of the palladium colloid catalyst which is usually applied in order to catalyze deposition of the initial metallic layer from an autocatalytic nickel or copper plating process. Following this, deposits of copper, nickel and chromium are typically applied.

The initial etching of the plastic components is an essential element of the overall process. However, only certain types of plastic components are suitable for plating. The most common types of plastic for electroplating are acrylonitrile/butadiene/styrene (ABS) or a blend of this material with polycarbonate (ABS/PC). ABS consists of two phases. The first is a relatively hard phase consisting of an acrylonitrile/styrene copolymer and a softer polybutadiene phase.

Currently, this material is etched almost exclusively using a mixture of chromic and sulfuric acids, which is highly effective as an etchant for ABS and ABS/PC. The polybutadiene phase of the plastic contains double bonds in the polymer backbone, which are oxidized by the chromic acid, thus causing complete breakdown and dissolution of the polybutadiene phase exposed at the surface of the plastic which gives an effective etch to the surface of the plastic.

One problem with the traditional chromic acid etching step is that chromic acid is a recognized carcinogen and is increasingly regulated, requiring that wherever possible, the use of chromic acid is replaced with safer alternatives. The use of a chromic acid etchant also has well-known and serious drawbacks, including the toxicity of chromium compounds which makes their disposal difficult, chromic acid residues remaining on the polymer surface that inhibit electroless deposition, and the difficulty of rinsing chromic acid residues from the polymer surface following treatment. Additionally, hot hexavalent chromic acid solutions are naturally hazardous to workers. Burns and upper respiratory bleeding are common in workers routinely involved with these chrome etch solutions. For many years, alternative processes have been sought, but an effective commercially suitable process has not yet been developed.

Early attempts to replace the use of chromic acid to etch plastic typically involved the use of permanganate ions as an alternative to chromic acid. The use of permanganate was described by U.S. Pat. No. 4,610,895 to Tubergen et al., the subject matter of which is herein incorporated by reference in its entirety. Later, the use of permanganate was described in combination with an ionic palladium activation stage as set forth in U.S. Pat. Pub. No. 2005/0199587 to Bengston, the subject matter of which is herein incorporated by reference in its entirety. The use of permanganate solutions in combination with perhalo ions (such as perchlorate or periodate) was described, for example in U.S. Pat. Pub. No. 2009/0092757 to Satou, the subject matter of which is herein incorporated by reference in its entirety. Finally, International Publication No. WO2009/023628 to Schildman et al., the subject matter of which is herein incorporated by reference in its entirety, described the use of permanganate ions in the absence of alkali metal or alkaline earth metal cations.

However, all of these attempts to etch plastic using permanganate ions have not been capable of producing etch characteristics which match those obtained by the use of chromic acid and the stability of these etch solutions is poor, resulting in the formation of manganese dioxide sludge.

As is readily seen, while many etching solutions have been suggested as a replacement for chromic acid in preparing non-conductive substrates for metallization, none of these processes have proven satisfactory for various economic, performance and/or environmental reasons and none of these processes have achieved commercial success or been accepted by the industry as suitable replacements for chromic acid etching. In addition, the stability of permanganate based etching solutions is also poor.

SUMMARY OF INVENTION

U.S. application Ser. No. 13/795,382 to Pearson et al., the subject matter of which is herein incorporated by reference in its entirety, describes an etch solution comprising trivalent manganese ions in a strong acid that is capable of etching ABS. Pearson found that trivalent manganese is unstable and is highly oxidizing, with a standard redox potential of 1.51 versus a normal hydrogen electrode. In solution, it very rapidly disproportionates to manganese dioxide and divalent manganese via the following reaction:

$$2Mn^{3+} + 2H_2O \rightarrow MnO_2 + Mn^{2+} + 4H^+ \tag{1}$$

However, Pearson found that in strong sulfuric acid solutions, trivalent manganese ions become meta-stable and form a cherry purple/red colored sulfate complex which provide a suitable medium for etching of ABS and which has many advantages over previously patented chromium-free etching solutions.

Unfortunately, because the solution is based on very strong sulfuric acid, the solution has a tendency to absorb water, which destabilizes the manganese(III) ions, causing them to disproportionate into manganese dioxide and manganese(II) ions. Additionally, at higher concentrations of Mn(III) ions, there is an increased tendency to create small amounts of manganese dioxide over time. Thus, this solution is also prone to generating manganese dioxide sludge during operation over time.

Because trivalent manganese etch solutions based on strong acid have been shown to provide a suitable medium for etching platable plastics, it would be desirable to solve the problem of manganese dioxide sludge generation to extend the life of the etch solution and provide a commercially acceptable etch solution based on trivalent manganese.

It is an object of the invention to provide an etchant for plastic substrates that does not contain chromic acid.

It is another object of the present invention to provide an etchant for plastic substrates that is commercially acceptable.

It is another object of the present invention to provide an etchant for plastic substrates that is based on manganese ions.

It is still another object of the present invention to provide a means for regenerating manganese(III) ion-based etchants to extend their life.

To that end, in one embodiment, the present invention relates generally to a method of regenerating an etch solution comprising a metastable complex of manganese(III) ions in a strong acid, wherein at least a portion of the manganese(III) ions have been destabilized, causing them to disproportionate into manganese dioxide and manganese(II) ions, the method comprising the steps of:
  a) Adding an effective amount of a reducing agent to the solution;
  b) Allowing the reducing agent to react with the solution to cause manganese dioxide to dissolve; and
  c) Applying an electrical current through an anode and a cathode in the solution to regenerate manganese(III) ions in the solution from the manganese(II) ions.

DETAILED DESCRIPTION OF THE PREFERRED EMBODIMENTS

As discussed above, solutions based on strong sulfuric acid have shown a tendency to absorb water, which destabilizes the manganese(III) ions, causing them to disproportionate into manganese dioxide and manganese(II) ions. In addition, there is an increased tendency to create small amounts of manganese dioxide over time. As a result, the solutions are prone to generating manganese dioxide sludge during operation. Based thereon, the inventors of the present invention have discovered that it is possible to regenerate solutions containing manganese(III) ions in which manganese dioxide sludge has built up to an unacceptable level.

The present invention relates generally to a method of regenerating solutions containing manganese(III) ions and an inorganic acid that have built up sludge (manganese dioxide) to an excessive level. The method involves the addition of a reducing agent, optionally heating the solution, and then applying an electrical current through an anode and a cathode in the solution to regenerate manganese(III) ions.

As described in related application Ser. No. 13/795,382 to Pearson et al., the subject matter of which is herein incorporated by reference in its entirety, trivalent manganese can readily be produced by electrolysis at low current density of divalent manganese ions in a strong acid solution, preferably a strong sulfuric acid solution, most preferably an at least 8M sulfuric acid solution. Further, a solution of trivalent manganese ions in a strongly acidic solution is capable of etching ABS and is thus a suitable replacement for chromic acid etching solutions.

As described above, trivalent manganese is unstable and is highly oxidizing (standard redox potential of 1.51 versus normal hydrogen electrode). In solution, it disproportionates to manganese dioxide and divalent manganese. However, in a strong sulfuric acid solution, the trivalent manganese ion becomes meta-stable and forms a cherry purple/red colored sulfate complex. This sulfate complex is a suitable medium for the etching of ABS and has many advantages over chromium-free etches of the prior art. In addition, while both phosphoric acid and sulfuric acid have been shown to be suitable for use in the electrolyte, in a preferred embodiment, the acid is sulfuric acid.

The stability of manganese(III) ions in strong sulfuric acid provides the following advantages in use:
  1) Because the Mn(III) ions are formed from Mn(II) at a low current density, the power requirements for the process are typically very low.
  2) Because the anode operates at a very low current density, a small cathode in relationship to the anode area can be used to prevent cathodic reduction of the Mn(III) ions. This obviates the need for a divided cell and makes the engineering of an etchant regeneration cell simpler.
  3) Because the process does not produce permanganate ions, there is no possibility of producing manganese heptoxide in the solution (this is a considerable safety hazard as it is violently explosive).
  4) Because of the high stability of the Mn(III) ions in strong sulfuric acid, the etchant can be sold ready for use. The etchant requires only a small regeneration cell at the side of the tank in order to maintain the Mn(III) content of the etch and prevent the build-up of Mn(II) ions.
  5) The electrolytic production of Mn(III) in accordance with the present invention does not produce any toxic gases. While some hydrogen may be produced at the cathode, owing to the low current requirements, this would be less than that produced by many plating processes.

The concentration of sulfuric acid in the Mn(III) etchant is preferably at least 8 molar, more preferably between about 9 and about 15 molar. The concentration of sulfuric acid is important in the process and in order to obtain rapid rates of etching on ABS plastic, it is necessary to use a high concentration of acid. Below a concentration of about 8 molar, the rate of etch becomes slow and above about 14 molar, the solubility of manganese ions in the solution becomes low. Additionally, very high concentrations of sulfuric acid tend to absorb moisture from the air and are hazardous to handle. Thus, the concentration of sulfuric acid is most preferably between about 12 and 13 molar, which is dilute enough to allow the safe addition of water to the etch and strong enough to optimize the etch rate of the plastic. At this concentration of sulfuric acid, up to around 0.08M of manganese sulfate can be dissolved at the preferred operating temperature of the etch. For optimal etching, the concentration of manganese(III) ions in solution should be as high as it is feasible to achieve.

The manganese(II) ions are preferably selected from the group consisting of manganese sulfate, manganese carbonate and manganese hydroxide although other similar sources of manganese(II) ions known in the art would also be usable in the practice of the invention. The concentration of manganese(II) ions may be in the range of between about 0.005 molar up to saturation. The electrolyte may also comprise colloidal manganese dioxide. This may form to some extent as a natural result of disproportionation of manganese(III) in solution, or may be added deliberately. Manganese(III) ions can be conveniently generated by electrochemical means by the oxidation of manganese(II) ions. In addition, it is generally preferable that the electrolyte not contain any permanganate ions.

As further described in U.S. Ser. No. 13/795,382, it is also possible to increase the amount of manganese that can be dissolved in the bath by replacing a portion of the sulfuric acid with another acid in which the manganese ions may be more soluble. Acids which would have both the necessary stability to oxidation and the ability to increase the solubility of manganese ions in the bath are methane sulfonic acid and methane disulfonic acid.

The electrochemical oxidation of manganese(II) ions to manganese(III) ions comprises the steps of:

providing an electrolyte comprising a solution of manganese(II) ions in at least one acid in an electrolytic cell wherein the electrolytic cell comprises an anode and a cathode;

applying a current between the anode and the cathode; and oxidizing the electrolyte to form manganese(III) ions, wherein the manganese(III) ions form a metastable complex.

Once the electrolyte has been oxidized to form the metastable complex, the platable plastic may be immersed in the metastable complex for a period of time to etch the surface of the platable plastic. In one embodiment, the platable plastic is immersed in the metastable complex a temperature of between 30 and 80° C. The rate of etching increases with temperature and is slow below 50° C.

The upper limit of temperature is determined by the nature of the plastic being etched. ABS begins to distort above 70° C., thus in a preferred embodiment the temperature of the electrolyte is maintained between about 50 and about 70° C., especially when etching ABS materials. The time period of the immersion of the plastic in the electrolyte is preferably between about 10 to about 30 minutes.

The present invention relates generally to a method of regenerating an etch solution comprising a metastable complex of manganese(III) ions in a strong acid, wherein at least a portion of the manganese(III) ions have been destabilized, causing them to disproportionate into manganese dioxide and manganese(II) ions, the method comprising the steps of:

a) Adding an effective amount of a reducing agent for the Mn(IV) of the manganese dioxide to the solution;

b) Allowing the reducing agent to react with the solution to cause manganese dioxide to dissolve; and c) Applying an electrical current through an anode and a cathode in the solution to regenerate manganese(III) ions in the solution.

The inventors of the present invention have determined that in the strongly acidic media, the use of hydrogen peroxide as a reducing agent causes the manganese dioxide sludge to dissolve and reduces the manganese(IV) species to soluble manganese(II) ions according to the reaction:

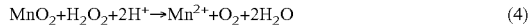

$$MnO_2 + H_2O_2 + 2H^+ \rightarrow Mn^{2+} + O_2 + 2H_2O \qquad (4)$$

The reaction of hydrogen peroxide in this way is surprising because it is most commonly used as a strong oxidizing agent and thus it would not be obvious to use hydrogen peroxide as a reducing agent in the manner suggested herein. The manganese(III) ions can be reduced to manganese(II) ions by the use of hydrogen peroxide in a strong acid also. The lack of soluble oxidation products which may compromise the continued performance of the etching solution is also desirable and hydrogen peroxide is ideal in this respect, producing only water and gaseous oxygen. Other suitable reducing agents include oxalic acid, ascorbic acid, formic acid and other organic acids which will leave no soluble by-products, producing only carbon dioxide and water.

In the case of hydrogen peroxide (35% w/w), the effective amount of reducing agent added to the etchant solution to cause manganese dioxide sludge in the solution to dissolve is about 0.5 ml/L to about 10 ml/L, more preferably about 2 ml/L to about 7 ml/L of the reducing agent per liter of etching solution. In the case of oxalic acid or formic acid, the effective amount of reducing agent added to the etchant solution is in the range of about 1 to about 10 g/L, more preferably about 2 to about 7 g/L.

In addition, the reducing agent may be added in stages. In other words, a portion of the reducing agent may be added and the solution allowed to react before an additional quantity of the reducing agent is added to the etch solution.

Optionally, but preferably, heat is applied to aid the reducing agent in reacting with the solution. Based thereon, the solution may be heated to a temperature of between about 30° C. and about 100° C., more preferably between about 60° C. and about 80° C.

Finally, it is noted that while the method described herein can be used to treat an entire working etch solution bath in an electrolytic cell, the etch solution in the electrolytic cell may be spilt into portions and each portion treated separately. For example, 10% of the bath may be diverted from the electrolytic cell and treated before being returned to the electrolytic cell, which would enable continuous treatment of the bath in a "feed and bleed" type system.

The invention will now be illustrated with reference to the following non-limiting examples:

EXAMPLE 1

An etching solution was prepared according to the procedure set forth in related application Ser. No. 13/795,382, containing 0.08M manganese sulfate and 12.5M sulfuric acid. The solution was electrolyzed at 70° C. at low anodic current density using a platinized titanium anode and a lead cathode. The anode area was 10 times the cathode area.

A cherry colored complex began to form and after several hours of electrolysis, the solution was a deep cherry purple color indicating the formation of the manganese(III) complex.

An ABS panel was immersed in the etch solution for 30 minutes, and then rinsed and dried. The panel was examined under a scanning electron microscope and exhibited the topography expected of a well etched ABS panel.

The solution was operated for more than 1 week at 70° C. and after this time, a noticeable amount of brown sludge had formed in the solution.

The solution was then cooled to 30° C. and treated as follows:

1) 1 ml/L of 35% w/w hydrogen peroxide was added to the solution. Gas quite vigorously evolved.
2) The solution was allowed to react for a further 30 minutes.
3) A further 2 ml/L of hydrogen peroxide was added and the solution allowed to react further for another 30 minutes. After this time, the appearance of the solution was turbid amber.
4) Heat was applied and the solution was heated to 80° C. for about an hour. During this time, the solution became clear and a pale amber color before turning a pale pink color.
5) A few extra drops of hydrogen peroxide were added and the solution returned to the amber color before eventually fading to a very pale pink, almost colorless, color characteristic of divalent manganese ions.
6) The solution was then electrolyzed again in the electrolysis cell under the same conditions as when the solution was first prepared.

7) A cherry colored complex began to form and continued electrolysis resulted in a very dark cherry purple color similar to the original etch solution.

An ABS panel was immersed in the regenerated etch solution for 30 minutes at 70° C. After treatment, the panel was examined by scanning electron microscopy and the panel surface was observed to exhibit the topography typical of that produced by a new etch solution.

EXAMPLE 2

An etching solution was prepared according to the procedure set forth in related application Ser. No. 13/795,382, containing 0.08M manganese sulfate and 12.5M sulfuric acid. The solution was electrolyzed at 70° C. at low anodic current density using a platinized titanium anode and a lead cathode. The anode area was 10 times the cathode area.

A cherry colored complex began to form and after several hours of electrolysis, the solution was a deep cherry purple color indicating the formation of the manganese(III) complex.

An ABS panel was immersed in the etch solution for 30 minutes, then rinsed and dried. The panel was examined under a scanning electronic microscope and exhibited the topography expected of an etched ABS panel.

The solution was operated for over a week at 70° C. and after this time, a noticeable amount of brown sludge had formed.

The solution was cooled to 30° C. and treated as follows:
1) 2 g/L of oxalic acid dihydrate was added to the solution.
2) The solution was allowed to react for 30 minutes.
3) A further 3 g/L of oxalic acid dihydrate was added and heat was applied. The solution was heated to 80° C. for about an hour. During this time, the solution became clear and eventually turned a pale pink almost colorless color.
4) A few extra drops of hydrogen peroxide were added to remove any excess oxalic acid. The solution turned an amber color before eventually fading to a very pale almost colorless pink color characteristic of divalent manganese ions.
5) The solution was then electrolyzed again in the electrolysis cell under the same conditions as when the solution was first prepared.
6) A cherry colored complex began to form and continued electrolysis resulted in a very dark cherry purple color similar to the original etch solution.

An ABS panel was immersed in the regenerated etch solution for 30 minutes at 70° C. After treatment, the panel was examined by scanning electron microscopy. The panel surface exhibited the topography typical of that produced by the new etch solution.

EXAMPLE 3

A similar treatment was carried out using formic acid as the reducing agent and produced similar results to Examples 1 and 2.

What is claimed is:

1. A method of regenerating an etch solution comprising a metastable complex of manganese(III) ions in a strong acid, wherein at least a portion of the manganese(III) ions have been destabilized, causing them to disproportionate into manganese dioxide and manganese(II) ions, the method comprising the steps of:
   a. adding an effective amount of a reducing agent for the Mn(IV) of the manganese dioxide to the etch solution;
   b. allowing the reducing agent to react with the etch solution to cause the Mn(IV) in the manganese dioxide to be reduced to Mn(II) and to dissolve; and
   c. applying an electrical current through an anode and a cathode in the etch solution to regenerate manganese (III) ions in the etch solution from manganese(II) ions;
   wherein the etch solution is at least substantially free of permanganate ions.

2. The method according to claim 1, wherein the reducing agent is selected from the group consisting of hydrogen peroxide, oxalic acid, formic acid and combinations of one or more of the foregoing.

3. The method according to claim 2, wherein the reducing agent comprises hydrogen peroxide.

4. The method according to claim 3, wherein the amount of hydrogen peroxide added to the solution is in the range of about 0.5 ml of hydrogen peroxide (35% by weight) per liter of etch solution, to about 10 ml of hydrogen peroxide (35% by weight) per liter of etch solution.

5. The method according to claim 4, wherein the amount of hydrogen peroxide added to the solution is in the range of about 2 ml of hydrogen peroxide (35% by weight) per liter of etch solution, to about 7 ml of hydrogen peroxide (35% by weight) per liter of etch solution.

6. The method according to claim 2, wherein the reducing agent comprises oxalic acid or formic acid.

7. The method according to claim 6, wherein the amount of oxalic acid or formic acid added to the solution is in the range of about 1 g/L to about 10 g/L.

8. The method according to claim 7, wherein the amount of oxalic acid or formic acid added to the solution is in the range of about 2 g/L to about 7 g/L.

9. The method according to claim 1, wherein a portion of the amount of reducing agent is added to the etch solution and the reducing agent allowed to react with the etch solution and, thereafter, an additional amount of the reducing agent is added to the etch solution and allowed to react with the etch solution.

10. The method according to claim 1, wherein the reducing agent is allowed to react with the etch solution for at least 30 minutes.

11. The method according to claim 1, wherein the reducing agent is allowed to react with the etch solution until all of the manganese dioxide in the solution has been dissolved.

12. The method according to claim 1, comprising the step of heating the etch solution after the reducing agent has been added to the etch solution.

13. The method according to claim 12, wherein the etch solution is heated to a temperature of between about 30° C. and about 100° C.

14. The method according to claim 13, wherein the etch solution is heated to a temperature of between about 60° C. and about 80° C.

15. The method according to claim 1, wherein a portion of the etch solution is diverted from a process tank containing the etch solution into a separate electrolytic cell and the portion of the etch solution which is diverted is regenerated and then recycled back into the process tank.

16. The method according to claim 15, wherein the portion of the etch solution that is diverted from the process tank is approximately 10% of the working volume of the process tank.

17. The method according to claim 15, wherein additional portions of etch solution are diverted from the process, whereby the etch solution can be continuously treated.

18. The method according to claim 1, wherein the strong acid comprises sulfuric acid.

19. A method of regenerating an etch solution comprising a metastable complex of manganese(III) ions in at least one acid, wherein the at least one acid comprises sulfuric acid and further comprises method sulfonic acid or methane disulfonic acid, wherein at least a portion of the manganese (III) ions have been destabilized, causing them to disproportionate into manganese dioxide and manganese(II) ions, the method comprising the steps of:
   a. adding an effective amount of a reducing agent for the Mn(IV) of the manganese dioxide to the etch solution;
   b. allowing the reducing agent to react with the etch solution to cause the Mn(IV) in the manganese dioxide to be reduced to Mn(II) and to dissolve; and
   c. applying an electrical current through an anode and a cathode in the etch solution to regenerate manganese (III) ions in the etch solution from manganese(II) ions.

20. The method according to claim 19, wherein the etch solution is at least substantially free of permanganate ions.

* * * * *